United States Patent [19]

Smith et al.

[11] Patent Number: 4,742,248
[45] Date of Patent: May 3, 1988

[54] RANDOM SIGNAL ISOLATION CIRCUIT

[75] Inventors: Patrick G. Smith, Shakopee; B. Hubert Pinckaers, Bloomington, both of Minn.

[73] Assignee: Detector Electronics Corporation, Minneapolis, Minn.

[21] Appl. No.: 66,191

[22] Filed: Jun. 25, 1987

[51] Int. Cl.$^4$ .............................................. H03K 5/22
[52] U.S. Cl. .................................... 307/234; 307/273; 307/520
[58] Field of Search ............... 307/234, 273, 518, 520; 328/109, 110

[56] References Cited

U.S. PATENT DOCUMENTS

| | | | |
|---|---|---|---|
| 3,555,434 | 1/1971 | Sheen | 307/520 X |
| 3,634,869 | 1/1972 | Hsueh | 307/234 |
| 3,689,846 | 9/1972 | Naeyaert | 328/63 |
| 3,835,336 | 9/1974 | Block | 307/234 |
| 3,944,934 | 3/1976 | Francis, Jr. | 328/119 |
| 3,970,944 | 7/1976 | Huellwegen | 328/162 |
| 4,048,521 | 9/1977 | Thompson et al. | 307/291 |
| 4,179,625 | 12/1979 | Carter | 307/234 |
| 4,282,488 | 8/1981 | Norman et al. | 328/112 |
| 4,353,032 | 10/1982 | Taylor | 328/165 |
| 4,525,635 | 6/1985 | Gillberg | 307/247 |
| 4,629,915 | 12/1986 | Suzuki et al. | 307/273 X |

*Primary Examiner*—Eugene R. LaRoche
*Assistant Examiner*—Steven J. Mottola
*Attorney, Agent, or Firm*—Paul L. Sjoquist

[57] ABSTRACT

A random signal isolation circuit connectable to a source of signal generation wherein signals of interest tend to occur at relatively closely spaced intervals, and noise signals tend to occur at random time intervals, including a first multivibrator trigger circuit which triggers on the falling edge of a received signal, and a second multivibrator trigger circuit which triggers on a rising edge of a received signal, the first multivibrator circuit being connected when triggered to enable the second multivibrator trigger to receive subsequent received signals. The first multivibrator trigger circuit is activated over a predetermined time delay, and at the end of the time delay disables the second multivibrator trigger circuit.

4 Claims, 1 Drawing Sheet

RANDOM SIGNAL ISOLATION CIRCUIT

BACKGROUND OF THE INVENTION

The present invention relates to noise detection circuits, and more particularly to circuits for rejecting noise signals which occur randomly and outside of a predetermined time pattern which is known to be representative of the time of occurrence of desired signals. The invention has particular application in conjunction with radiation detection tubes, which generate electrical signals upon receipt of incident radiation over predetermined light wavelengths. Such radiation detection tubes characteristically generate random noise signals over widely-spaced time intervals, such signals having no relation to incident light or electromagnetic radiation, but are thought to be caused by internal physical reactions within the radiation detection tube.

Among the uses of radiation detection tubes in industrial applications is the use of such tubes to detect incident electromagnetic radiation over predetermined band widths characteristic of radiation band widths caused by fire or flame. Such detection devices have particular utility as fire detectors, for their output signals can be closely coordinated with predetermined band widths of radiation which are associated with flame radiation. If radiation detection tubes for this application are properly designed and selected, they will generate output signals upon receipt of incident flame radiation, but will reject incident radiation outside of a predetermined narrow band width and as a consequence of such extraneous incident radiation will generate no substantial output signals. A characteristic of these devices is that the repetition of output signal generation is directly related to the intensity of a flame, wherein an initial start of a fire will cause the generation of a few closely spaced signals, and as a fire increases in intensity the number of generated signals increase in frequency.

On the other hand, such detection devices suffer from the disadvantage that internal physical reactions tend to generate occasional and random signals, such signals being totally unpredictable as to time of occurrence, but generally sufficiently widely spaced in time so as to be recognizable as "false" signals. In any application where such a radiation detection tube is utilized as the flame detecting device, it is therefore important to discriminate between "false" signals and signals which are truly representative of a detected flame. This is particularly true in industrial applications wherein a flame detector may be utilized as a sensing element to set off a fire extinguishing system, including water sprinklers, chemical fire extinguishers, or other fire retarding measures. If such devices are set off by random noise signals they will usually cause great and unwarranted damage to the area being monitored. It is therefore important that such fire detection systems reliably detect the existence of a real flame, but equally reliably reject the occasional noise signals which are inherently generated within radiation detection tubes, so as to initiate fire extinguishing and other emergency measures only when absolutely necessary.

SUMMARY OF THE INVENTION

The invention includes a first monostable multivibrator circuit having an input connected to receive the output signals from a radiation detector tube or the like. These output signals are in the form of squared pulses, usually, but not necessarily, of relatively short time duration; i.e., usually in the range of 40–100 microseconds. The first monostable multivibrator circuit has a triggered output line, which is coupled to a reset input of a second monostable multivibrator circuit. The second monostable multivibrator circuit also has an input connected to receive the same output signal from a radiation detection tube or the like; the first multivibrator circuit is adapted to generate a trigger signal at the trailing edge of a received signal, whereas the second multivibrator circuit is adapted to generate a trigger signal at the leading edge of a received signal. Both multivibrator circuits have an internal timing feedback circuit, wherein their output signals are present only for a predetermined time determined by the respective feedback circuits. The first multivibrator circuit triggers on the trailing edge of a received signal, thereby enabling the second multivibrator circuit to trigger on the leading edge of the next subsequent received signal. However, if no subsequent received signal is received within a predetermined time, as set by the internal feedback circuit of the first multivibrator circuit, the enable signal is removed to the second multivibrator circuit and the second multivibrator circuit thereafter becomes insensitive to further received signals. If a subsequent signal is received within the time frame defined by the feedback circuit of the first multivibrator the next subsequent signal received will trigger the second multivibrator circuit and will generate a predetermined output signal which is representative of the received signal.

It is an object and feature of the present invention to reject extraneous received signals which are spaced in time beyond a predetermined time window.

It is a further object and feature of the present invention to accept and reproduce received signals which are received at time intervals which are less than certain predetermined time intervals.

BRIEF DESCRIPTION OF THE DRAWINGS

The foregoing objects, features and advantages of the invention will become apparent from the following specification and claims, and with reference to the appended drawings, in which:

DESCRIPTION OF THE PREFERRED EMBODIMENT

Figure 1:
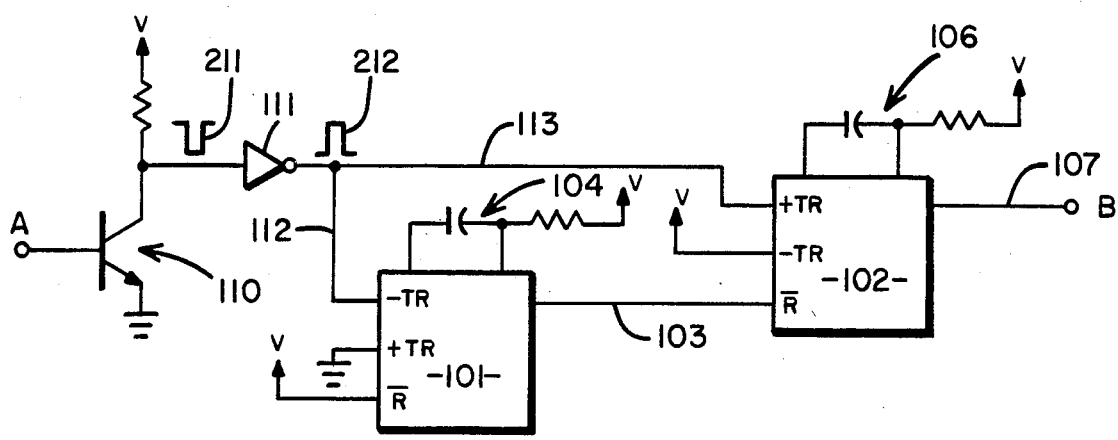
FIG. 1 shows a representative schematic diagram of the invention.

Referring first to FIG. 1 the invention is shown in a preferred schematic diagram form. In particular, an input A is representative of a terminal for receiving all signals from a radiation detection tube or the like, or from a circuit associated with the output of a radiation detection tube or the like. The received signals are coupled into amplifier 110, producing a negative-going output signal 211. The output signal 211 is coupled into a Schmitt trigger with inverter, referred to herein for convenience as inverter amplifier 111, thereby producing a positive-going signal 212. A commercially available circuit which is usable for this purpose is made by RCA under type designation CD40106. Signal 212, which is in the form of a square pulse, is coupled to multivibrator input lines 112 and 113, each of which are connected to a trigger input terminal of respective multivibrator circuits. Multivibrator circuit 101 and multivibrator circuit 102 are each dual monostable multivibrators, and may be formed from circuits within the same semiconductor chip. For example, a semiconductor circuit manufactured by RCA under type designation CD4098 or CD4538 is suitable for these purposes, having therein monostable multivibrators adaptable for this application. The monostable multivibrators each have two trigger inputs, a trigger input designated +TR which causes the monostable multivibrator to trigger upon receiving a positive-going input signal; a multivibrator input designated −TR which causes the monostable multivibrator to trigger upon receipt of a negative-going signal. Line 112 is connected into circuit 101 at the −TR trigger input; line 113 is connected into circuit 102 at the +TR trigger circuit input. Therefore, multivibrator 101 will trigger upon receipt of negative-going input signal on line 112, and multivibrator 102 will trigger upon receipt of a positive-going signal on line 113. Circuits 101 and 102 are retriggerable, which means that if an input trigger signal is received before the circuit has become fully timed out after receipt of a previous input trigger signal, the reset time will be extended by the most recent input trigger signal.

Multivibrator 101 has a +TR trigger input directly connected to ground, this connection effectively disables the +TR trigger input into multivibrator 101. Multivibrator 102 has a −TR input directly connected to the supply voltage V. This connection effectively disables the −TR trigger input to multivibrator 102. Multivibrator 101 has an inverted reset signal terminal $\overline{R}$ which is connected directly to the supply voltage V. This connection effectively disables the inverted reset signal terminal into multivibrator 101.

Multivibrator circuit 101 has a triggered output line 103, which is coupled to an inverted reset signal terminal $\overline{R}$ on multivibrator 102. Thus, the presence of a trigger signal on line 103 will remove the reset signal input into multivibrator 102, and the absence of a signal on line 103 will cause a reset signal to be held at the input of multivibrator circuit 102. In other words, a trigger signal on line 103 removes the reset clamp from multivibrator 102, at all other times multivibrator circuit 102 is held in a reset state and cannot be triggered.

Multivibrator circuit 101 has a capacitive feedback circuit 104, which regulates the time during which a trigger signal may be present on line 103. By proper selection of the resistance and capacitance in feedback circuit 104, the time of the output trigger circuit on line 103 may be carefully regulated. In the preferred embodiment this time is selected to be approximately 50 milliseconds (ms), which is accomplished by selecting a resistance value of 1.2 megohms and a capacitance value of 0 1 microfarads. Similarly, multivibrator circuit 102 also has a feedback circuit 106, which regulates the time during which a trigger output may be presented on triggered output line 107 from multivibrator 102. In the preferred embodiment this time is selected to be approximately 7 milliseconds (ms), which is accomplished by selecting a resistance value of 169 kilohms, and a capacitance value of 0.1 microfarads. The proper selection of the resistance and capacitive values of feedback circuit 106 will therefore determine the time duration of the output trigger signal on line 107.

Figure 2:
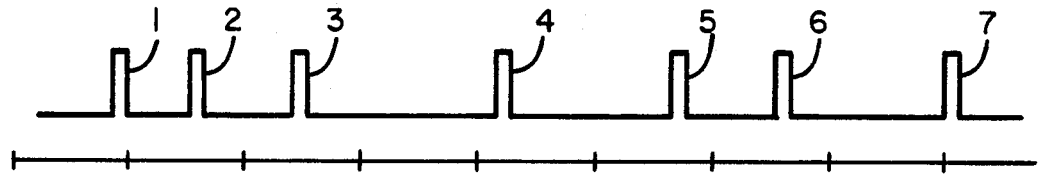
FIG. 2 shows a signal timing sequence including several extraneous noise signal representations.

Assuming feedback circuit 104 to be selected to provide a 50 millisecond output signal on line 103 for every negative-going trigger signal received on line 112, the circuit will then reject any input signals received at terminal A which occur at time intervals greater than 50 milliseconds from the last preceding input signal received at terminal A. FIG. 2 is a representative diagram showing the time sequence of various input signals received at terminal A, which signals have been numbered 1, 2, . . . 7, to represent their sequential time of arrival. The relative time scale shown on FIG. 2 represents 50 milliseconds between each scale mark. Therefore, on the assumptions made above, signal number 1 would be rejected by the circuit as it is not preceded by any signal that occurred within 50 milliseconds. Signal number 2 occurring within 50 milliseconds after signal number 1, would not be rejected by the circuit and would be evidenced by a 7-millisecond output signal on line 107 from multivibrator circuit 102. Similarly, signal number 3 would be passed by the circuit and would generate an output signal on line 107. Signal number 4 would be rejected by the circuit, as it occurs more than 50 milliseconds after the occurrence of signal number 3. Similarly, signal number 5 would be rejected by the circuit because it occurs more than 50 milliseconds after the receipt of signal number 4. Signal number 6 would pass through the circuit, as it occurs less than 50 milliseconds after the occurrence of signal number 5. Signal number 7 would be rejected by the circuit as it occurs more than 50 milliseconds after the occurrence of signal number 6.

Figure 3:
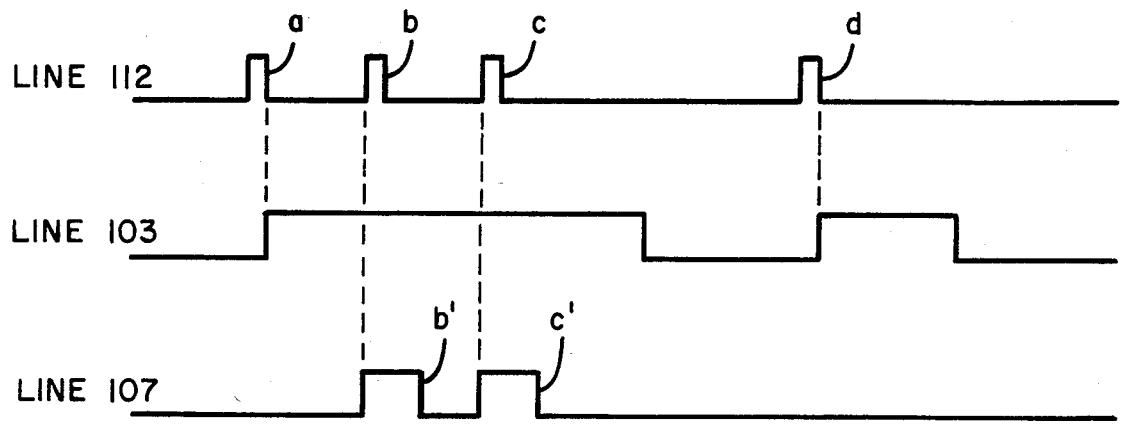
FIG. 3 shows a timing diagram of the invention in a typical operating sequence.

FIG. 3 shows a timing diagram of certain signals and signal relationships within the overall circuit. The first signal representation illustrates a sequence of signals on line 112, as shown in the schematic of FIG. 1. The signals on line 112 are in fact representative of the input signals received at input terminal A. The second line of the timing diagram shows the signals which would be responsive to the signals on line 112, and which would appear on line 103, the output of multivibrator 101. The third line shows the signals which would be responsive to the signals on lines 113 and 103, and which would appear on line 107, the output of multivibrator 102. The timing diagram of FIG. 3 is useful in understanding the operation of the circuit.

The timing diagram of FIG. 3 presumes the arrival of four input signals at input terminal A, and consequently present on lines 112 and 113, designated a, b, c, d. The signal a arrives at a time greater than 50 milliseconds after the next preceding signal which had arrived at input terminal A. Signal b arrives within 50 milliseconds after signal a; signal c arrives within 50 milliseconds after signal b; signal d arrives more than 50 milliseconds after signal c. The trailing edge of signal a causes multivibrator 101 to become activated, thereby producing a signal on line 103. The signal on line 103 removes the reset signal imposed at the $\overline{R}$ input of multivibrator 102, thereby leaving it sensitive to the arrival of a positive-going trigger signal on line 113. The next subsequent positive-going signal on line 113 occurs with the leading edge of signal b, and since this leading edge occurs within the 50 millisecond time set by feedback circuit 104, it results in the actuation of multivibrator 102. When multivibrator 102 becomes activated a signal is generated on line 107. The signal remains on line 107 for the time period determined by feedback circuit 106, which in this case may be presumed to be less than 50 milliseconds. The timing diagram shows this signal on line 107 as b', which is effectively a reproduction and representation of the signal b received on lines 112 and 113. The signal c arrives within 50 milliseconds after the signal b, and its trailing edge generates another trigger input signal to multivibrator 101. Multivibrator 101 remains activated, as evidenced by the continuing signal on line 103, and therefore multivibrator 102 again becomes activated by the signal c. This produces an output signal on line 107, designated c′, which is a reproduction and representation of signal c. At some time later, greater than 50 milliseconds, signal d arrives on line 112. The trailing edge of signal d causes multivibrator circuit 101 to become activated, thereby generating a signal on line 103. This removes the reset input signal to multivibrator 102, and conditions it for the next subsequent arrival of a positive-going trigger signal on line 113. However, no positive-going trigger signal on line 113 occurs within the time delay set by circuit 104, and therefore multivibrator 101 becomes deactivated and the signal on line 103 is removed.

The foregoing description shows that for input signals arriving within a time interval determined by the time delay of circuit 104 are faithfully reproduced at the output line 107. Other signals, which occur at times greater than the time delay set by circuit 104, are effectively rejected by the circuit and are not passed via line 107. Since, in the application for which the invention is primarily intended, it is known that random noise signals most frequently occur at time intervals greater than the 50 milliseconds, the circuit serves as an effective noise rejection circuit for such conditions.

The invention is preferably used in conjunction with radiation detection tubes which are capable of detecting radiation in the ultraviolet frequency spectrum. When such devices are utilized as fire detector radiation tubes it is important that the tube dark count pulse rate be less than about 5 counts per minute. When such tubes are used in applications as fire monitors, it is permissible for the tubes to have dark count rates which are less than about 30 counts per minute. For most other useful applications it is important for the tubes to have dark count characteristics less than about 50 counts per minute for a successful operation. Within these bounds, the aforementioned and described circuit has proven to be an effective dark count rejection circuit in a wide variety of practical applications.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A signal selection and isolation circuit having an input terminal adapted for receiving signals in a time domain, each of said signals having a leading edge, a time duration, and a trailing edge, wherein consecutive signals which occur within a first predetermined time window are considered as selectable signals, and consecutive signals which occur outside said first predetermined time window are considered as noise signals, comprising
    (a) a first monostable multivibrator circuit having a trigger input connected to said input terminal, said trigger input being responsive to the trailing edge of signals received at said input terminal, and said circuit having a first output means for generating first output signals corresponding to said trailing edge of signals received, and said circuit having a first predetermined time resetting means for limiting the time duration of said first output signals; and
    (b) a second monostable multivibrator circuit having a trigger input connected to said input terminal, said trigger input being responsive to the leading edge of signals received at said input terminal, and said circuit having a second output means for generating second output signals, and said circuit having a second predetermined time resetting means for limiting the time duration of said second output signals, and said circuit having a reset input means connected to said first monostable multivibrator first output means, for enabling generation of second output signals by said second circuit only during a time when said first circuit is generating a first output signal.

2. The circuit of claim 1, wherein said first and second predetermined time resetting means each further comprise a resistance/capacitance circuit.

3. The circuit of claim 2, wherein said first predeterined time resetting means further comprises a resistance/capacitance feedback circuit having an actuable time resetting limit of about fifty milliseconds.

4. The circuit of claim 3, wherein said second predetermined time resetting means further comprises a resistance/capacitance feedback circuit having an actuable time resetting limit of less than about fifty milliseconds.

* * * * *